United States Patent
Cao et al.

(10) Patent No.: US 9,214,481 B2
(45) Date of Patent: Dec. 15, 2015

(54) TFT-LCD, DRIVING DEVICE AND MANUFACTURING METHOD THEREOF

(75) Inventors: Kun Cao, Beijing (CN); Ming Hu, Beijing (CN)

(73) Assignee: BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 74 days.

(21) Appl. No.: 13/284,157

(22) Filed: Oct. 28, 2011

(65) Prior Publication Data

US 2012/0104398 A1 May 3, 2012

(30) Foreign Application Priority Data

Oct. 29, 2010 (CN) .......................... 2010 1 0532032

(51) Int. Cl.
  *H01L 27/12* (2006.01)
  *H01L 29/45* (2006.01)
  *H01L 29/49* (2006.01)

(52) U.S. Cl.
  CPC ........... *H01L 27/1251* (2013.01); *H01L 29/458* (2013.01); *H01L 29/4908* (2013.01)

(58) Field of Classification Search
  CPC ..................... H01L 27/1251; H01L 29/78663; H01L 29/78666; H01L 29/78669
  USPC ......... 257/59, 88, E33.053, E21.412; 438/30, 438/34, 158, 482
  See application file for complete search history.

(56) References Cited

U.S. PATENT DOCUMENTS

| | | | | |
|---|---|---|---|---|
| 4,862,234 A | * | 8/1989 | Koden | ............................ 257/60 |
| 4,951,113 A | | 8/1990 | Huang et al. | |
| 2007/0247412 A1 | * | 10/2007 | Yu | ................................. 345/100 |
| 2009/0002590 A1 | | 1/2009 | Kimura | |
| 2009/0086117 A1 | * | 4/2009 | Chen | ................................. 349/43 |
| 2010/0032665 A1 | | 2/2010 | Yamazaki et al. | |
| 2010/0302230 A1 | * | 12/2010 | Moon et al. | ................... 345/212 |

FOREIGN PATENT DOCUMENTS

| | | |
|---|---|---|
| CN | 101335273 A | 12/2008 |
| CN | 101398582 A | 4/2009 |
| CN | 101645462 A | 2/2010 |

OTHER PUBLICATIONS

First Chinese Office Action dated Oct. 11, 2013; Appln. No. 201010532032.8.
Second Chinese Office Action dated Mar. 26, 2014; Appln. No. 201010532032.8.

* cited by examiner

*Primary Examiner* — Tucker Wright
(74) *Attorney, Agent, or Firm* — Ladas & Parry LLP (57) ABSTRACT

An embodiment of the disclosed technology provides a driving device for a thin film transistor liquid crystal display (TFT-LCD) and a method for manufacturing the same. The driving device comprises at least one first TFT and at least one second TFT formed a base substrate, wherein load of the first TFT is larger than load of the second TFT, the first TFT is of a top-gate configuration, and the second TFT is of a bottom-gate configuration.

5 Claims, 10 Drawing Sheets

TFT-LCD, DRIVING DEVICE AND MANUFACTURING METHOD THEREOF

BACKGROUND

Embodiments of the disclosed technology are related to a thin film transistor liquid crystal display (TFT-LCD), a driving device and a manufacturing method thereof.

The driving devices in a TFT-LCD are mainly implemented with silicon integrated circuits (ICs). In these years, with the advance of TFT technologies, a solution which integrates TFTs on an array substrate to form driving devices is introduced. For example, amorphous silicon TFTs can be used to form gate line drivers, data line drivers, and the like on an array substrate.

When driving devices are formed with amorphous silicon TFTs, some TFTs which have relatively more driving capability are needed. For having more driving capability, these TFTs usually have bigger width-to-length (W/L) ratios of their channels; thus these amorphous silicon TFTs typically have bigger sizes and occupy more areas on the array substrate, which limits the miniaturization possibility of the TFT-LCD comprising the array substrate.

SUMMARY

An embodiment of the disclosed technology provides a driving device for a thin film transistor liquid crystal display (TFT-LCD), comprising: at least one first TFT and at least one second TFT formed a base substrate, wherein load of the first TFT is larger than load of the second TFT, the first TFT is of a top-gate configuration, and the second TFT is of a bottom-gate configuration.

Another embodiment of the disclosed technology provides a thin film transistor liquid crystal display (TFT-LCD), comprising: a backlight and the above-described a driving device, wherein the amorphous silicon layer of the first TFT of the driving device is illuminated by the backlight.

Further another embodiment of the disclosed technology provides a method for manufacturing a driving device for a thin film transistor liquid crystal display (TFT-LCD) comprising: Step 11, with a first patterning process, forming a source electrode, a drain electrode and a first doped amorphous silicon layer of a first thin film transistor (TFT) on a base substrate and a gate electrode of a second TFT; Step 12, with a second patterning process, on the base substrate after Step 11, forming an insulation thin film, removing the insulation thin film over a channel region of the first TFT, and keeping the insulation thin film over the gate electrode of the second TFT, whereby forming a first insulation layer of the second TFT; and Step 13, on the base substrate after Step 12, forming an amorphous silicon layer, a gate electrode and a second insulation layer of the first TFT, and forming an amorphous silicon layer, a second doped amorphous silicon layer, a source electrode, a drain electrode and a channel of the second TFT.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

The disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

Figure 1:
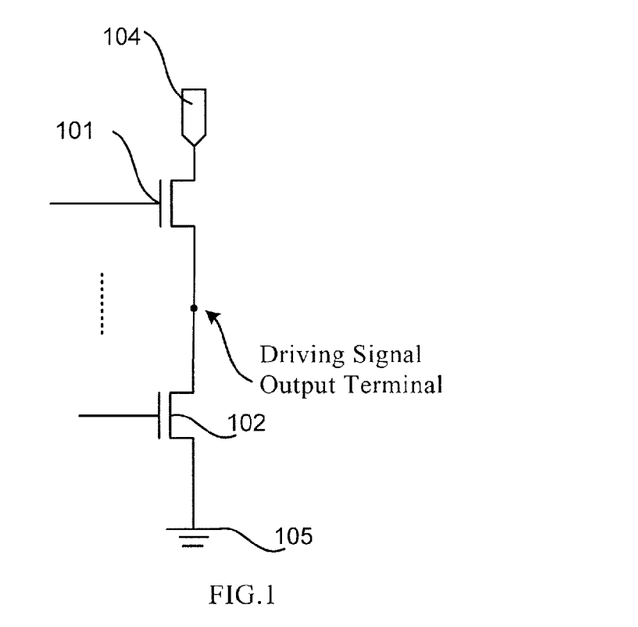
FIG. 1 shows a schematic structure view of a TFT-LCD driving device according to a first embodiment of the disclosed technology.

FIG. 1 shows a schematic structure view of a TFT-LCD driving device according to a first embodiment of the disclosed technology. This driving device comprises at least one first thin film transistor (TFT) 101 and at least one second TFT 102, which are both formed on an array substrate (not shown); the first TFT 101 has a bigger load than the second TFT 102. In an example, the first TFT 101 is implemented in a top-gate configuration, and the second TFT 102 is implemented in a bottom-gate configuration. A source or drain electrode of the first TFT 101 can be used as the driving signal output terminal of the TFT-LCD driving device. The other electrode in the source and drain electrodes of the first TFT 101 than that used as the driving signal output terminal can be connected with a control signal input terminal 104 such as a clock signal input terminal. One of the source and drain electrodes of the second TFT 102 is connected with the driving signal output terminal of the first TFT 101, and the other one is connected with a ground terminal 105.

It should be understood that FIG. 1 shows only one example about how to connect a first TFT 101 and a second TFT 102, and the disclosed technology is not limited to this example.

In the embodiments of the disclosed technology, "top-gate configuration" means the structure in which the gate electrode of a TFT is provided above the level of the source and drain electrodes of the TFT; "bottom-gate configuration" means the structure in which the gate electrode of a TFT is provided below the level of the source and drain electrodes of the TFT.

In a driving device which is formed with amorphous silicon TFTs, some TFT needs a bigger turning-on current, such as the TFT connected with a clock signal input terminal; in order to have a bigger turning-on current without increasing the channel W/L ratio, one or more of these TFTs can be implemented in a top-gate configuration, thereby the amorphous silicon layer (that is, the active layer) of the top-gate configuration TFT can be illuminated by light from a backlight and thus its turning-on current can be increased notably.

The working principle of the driving device according to the embodiment of the disclosed technology will be explained below in detail.

Ion (turning-on current) is an important parameter of a TFT, and it refers to the current at the drain electrode of a TFT under a certain gate voltage and a certain source-drain voltage (i.e., the voltage applied across the source and drain electrodes of the TFT).

In the driving device according to the embodiment of the disclosed technology, the first TFT is in a top-gate configuration. The backlight of a LCD is provided under or behind the array substrate on which the driving device is provided, thus the amorphous silicon layer of such first TFT can be illuminated by the light emitted from the backlight, and this light illumination can increase the Ion value of the first TFT, thereby the first TFT can obtain an improved driving capability.

In the driving device according to the embodiment of the disclosed technology, the first TFT's amorphous silicon layer can be illuminated by the light emitted from a backlight, and its Ion value can be increased remarkably, thus it is unnecessary to increase the channel W/L ratio of the first TFT for obtaining a certain big Ion value, which can reduce the size of the driving device, compared with the TFT obtained according to the conventional technology.

Examples of the driving device of the embodiment according to the disclosed technology will be described in the following.

In a TFT-LCD, driving devices can be formed with TFTs. For example, a gate line driver may comprise shift-register units, and each shift-register unit may comprise four TFTs and one capacitor.

Figure 2:
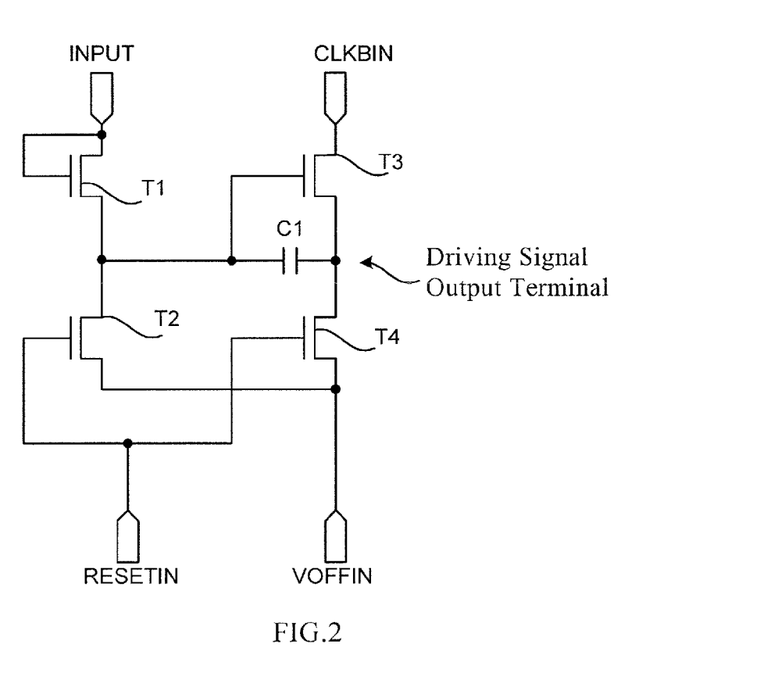
FIG. 2 shows a schematic structure view of a TFT-LCD driving device according to a second embodiment of the disclosed technology.

FIG. 2 shows a schematic structure view of a TFT-LCD driving device according to a second embodiment of the disclosed technology. This driving device is a shift-register unit in a gate line driver, and this shift-register unit comprises four TFTs, i.e., TFT T1, TFT T2, TFT T3 and TFT T4.

The drain electrode and the gate electrode of TFT T1 are both connected with a first signal input terminal (INPUT). Because the driving device in FIG. 2 is a shift-register unit, the first signal input terminal (INPUT) is connected with the signal output terminal of the immediately preceding shift-register unit.

The drain electrode of TFT T2 is connected with the source electrode of TFT T1, and the gate electrode of TFT T2 is connected with a reset signal input terminal (RESETIN), which is in turn connected with the signal output terminal of the immediately following shift-register unit, thus the reset signal of the shift-register unit as shown in FIG. 2 is provided as the output signal of the immediately following shift-register unit. The source electrode of TFT T2 is connected with a low level signal input terminal (VOFFIN), which is used to input a low level signal.

The gate electrode of TFT T3 is connected with the source electrode of TFT T1 and the drain electrode of TFT T2; in the embodiment as shown in FIG. 2, the source electrode of TFT T3 is used as the driving signal output terminal for outputting a gate line driving signal.

The drain electrode of TFT T4 is connected with the source electrode of TFT T3, and the gate electrode of TFT T4 is connected with the reset signal input terminal (RESETIN), and the source electrode of TFT 14 is connected with the low level signal input terminal (VOFFIN).

In FIG. 2, the two ends of the capacitor C1 are respectively connected with the gate electrode and the source electrode of TFT T3, and the source electrode of TFT T1 is connected with one end of capacitor C1 as well.

In the shift-register unit in FIG. 2, the source electrode of TFT T3 needs to output a gate line driving signal, thus it is necessary for TFT T3 to have a stronger driving capability than other TFTs; in this situation, TFT T3 can be regarded as the first TFT in a top-gate configuration, meanwhile the other TFTs can be regarded as the second TFTs in a bottom-gate configuration.

When the TFT-LCD is in operation, the backlight is lighted for providing the array substrate with light for display, and the amorphous silicon layer of the TFT T3 is illuminated by the backlight, thus TFT T3 can possess a stronger driving capability even although it has the same size as one TFT that is obtained according to the conventional technology.

Figure 3:
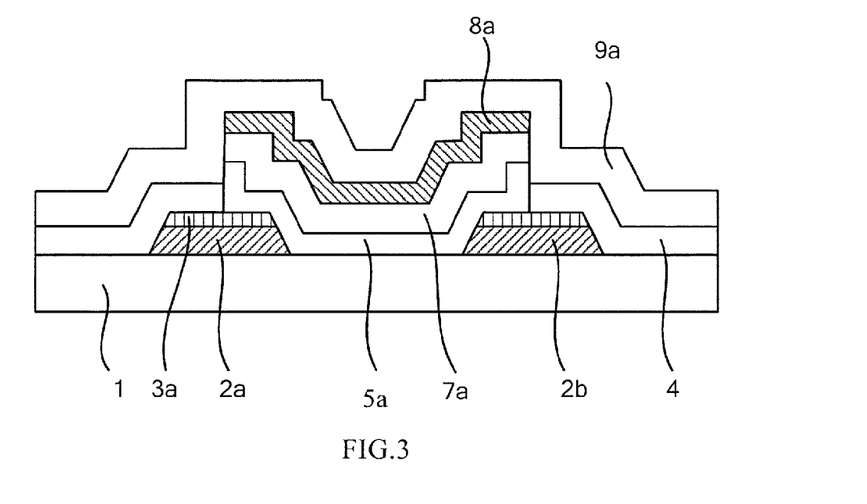
FIG. 3 shows a schematic structure view of an example of the first TFT of the TFT-LCD driving device according to the embodiment of the disclosed technology.

FIG. 3 shows a schematic structure view of an example of the first TFT of the TFT-LCD driving device according to the embodiment of the disclosed technology. This example of the first TFT has a structure in which the source electrode 2a and the drain electrode 2b are formed on a base substrate 1. A first doped amorphous silicon layer 3a is formed on the source electrode 2a and the drain electrode 2b, and may be formed only at the positions where the source electrode 2a and the drain electrode 2b are provided. An amorphous silicon layer 5a is provided on the first doped amorphous silicon layer 3a and in the region where the channel of the TFT is defined. A second insulation layer 7a is provided on the amorphous silicon layer 5a, and the gate electrode 8a is provided on the second insulation layer 7a.

The first TFT as shown in FIG. 3 may further comprise a passivation layer 9a. This passivation layer 9a can be formed to cover the entire first TFT (and possibly also other elements on the array substrate) and functions to protect the first TFT.

Figure 4:
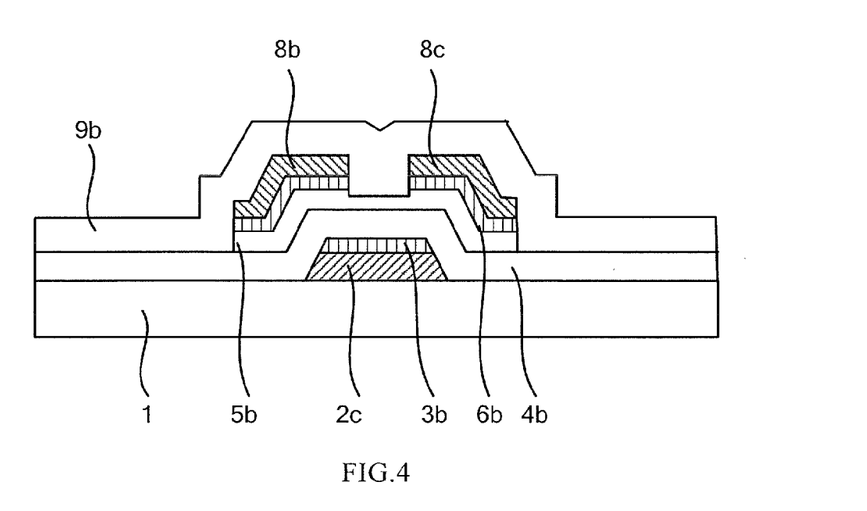
FIG. 4 shows a schematic structure view of an example of the second TFT of the TFT-LCD driving device according to the embodiment of the disclosed technology.

FIG. 4 shows a schematic structure view of an example of the second TFT of the TFT-LCD driving device according to the embodiment of the disclosed technology. The example of the second TFT has a structure in which a gate electrode 2c is formed on a base substrate 1 of the array substrate. A first insulation layer 4b is formed on the gate electrode 2c. Between the gate electrode 2c and the first insulation layer 4b, there is formed a first doped amorphous silicon layer 3b. An amorphous silicon layer 5b is formed on the first insulation layer 4b. A second doped amorphous silicon layer 6b is formed on the amorphous silicon layer 5b. A source electrode 8b and a drain electrode 8c are formed on the second doped amorphous silicon layer 6b, and a channel of the second TFT is defined between the source electrode 8b and the drain electrode 8c.

As shown in FIG. 4, the second TFT may further comprise a passivation layer 9b. The passivation layer 9b may be formed to cover the entire second TFT (and also possibly other elements on the array substrate) and protect the second TFT.

In the following, two examples of the method to manufacture the first TFT and second TFT will be described in detail, and in each example, the first TFT as shown in FIG. 3 and the second TFT as shown in FIG. 4 can formed simultaneously. In this disclosure, a patterning process used in the disclosed technology may comprise photoresist applying, masking, exposing and developing, etching with photoresist pattern, and so on. A kind of positive photoresist is used as an example for description purpose, that is, an unexposed portion is left but an exposed portion is removed in development.

First Example of Manufacturing Method

Figure 5A:
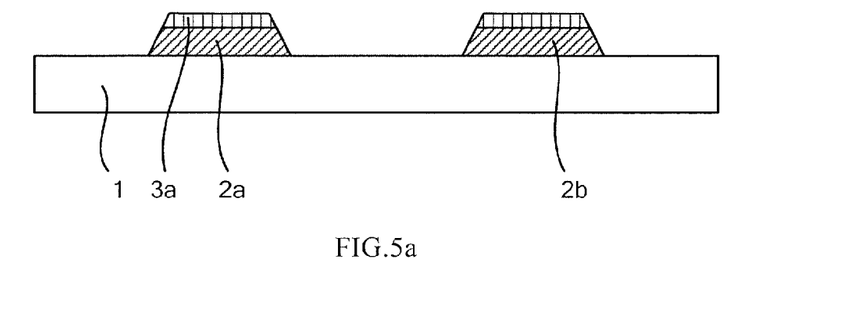
FIG. 5a shows the cross-sectional view after a first patterning process in the first example of the method for manufacturing the first TFT as shown in FIG. 3.
Figure 5B:
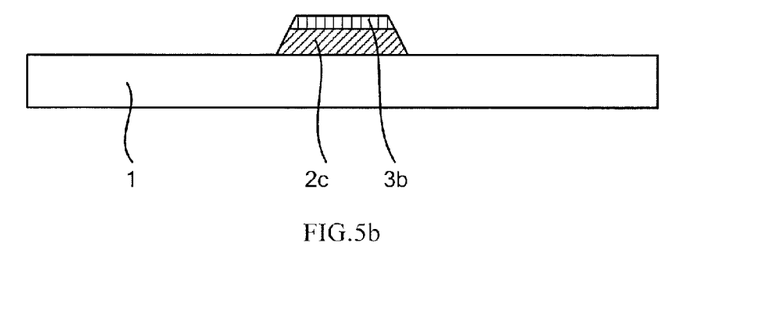
FIG. 5b shows the cross-sectional view after the first patterning process in the first example of the method for manufacturing the second TFT as shown in FIG. 4.

FIG. 5a shows the cross-sectional view after a first patterning process in the first example of the method for manufacturing the first TFT as shown in FIG. 3; FIG. 5b shows the cross-sectional view after the first patterning process in the first example of the method for manufacturing the second TFT as shown in FIG. 4. First, with a sputtering or thermal evaporation method, a layer of metal thin film is formed on a base substrate 1 (for example, glass substrate or quartz substrate), and then a layer of doped amorphous silicon thin film is formed on the layer of metal thin film. The material of this metal thin film layer may be a metal material such as Cr, W, Ti, Ta, Mo, Al, Cu or any alloy thereof, and this metal thin film layer may comprise sub-layers, that is, in a multiple-layer structure. With a normal mask plate for exposure, this metal thin film layer and the doped amorphous silicon thin film on the metal thin film layer is etched in a first patterning process to form the pattern comprising a source electrode 2a, a drain electrode 2b, and a first doped amorphous silicon layer 3a on both the electrodes 2a and 2b of the first TFT and a gate electrode 2c and a first doped amorphous silicon layer 3b on the gate electrode 2c of the second TFT on the base substrate 1.

In another example of the first patterning process, a grey tone or half tone mask plate may be used to form the gate electrode 2c of the second TFT without forming the first doped amorphous silicon layer 3b on the gate electrode 2c. In particular, a photoresist layer is first applied (for example, by coating) on the doped amorphous silicon thin film and then exposed with a grey tone or half tone mask plate so as to obtain a partially-exposed region corresponding to the gate electrode 2c of the second TFT, an unexposed region corresponding to the source electrode 2a, the drain electrode 2b and the first doped amorphous silicon layer 3a of the first TFT, and a completely-exposed region corresponding to remaining regions on the base substrate 1. The photoresist layer after exposed is developed to form a photoresist pattern as an etching mask. With a first etching, the metal thin film and the doped amorphous silicon thin film in the completely-exposed region is removed. Next, an ashing process is conducted to remove the photoresist in the partially-exposed region and reduce the thickness of the photoresist in the completely-exposed region. Then, a second etching is conducted with the thus obtained photoresist pattern to remove the doped amorphous silicon thin film in the partially-exposed region, thus forming pattern comprising the source electrode 2a, the drain electrode 2b and the first doped amorphous silicon layer 3a of the first TFT and the gate electrode 2c of the second TFT.

Figure 6A:
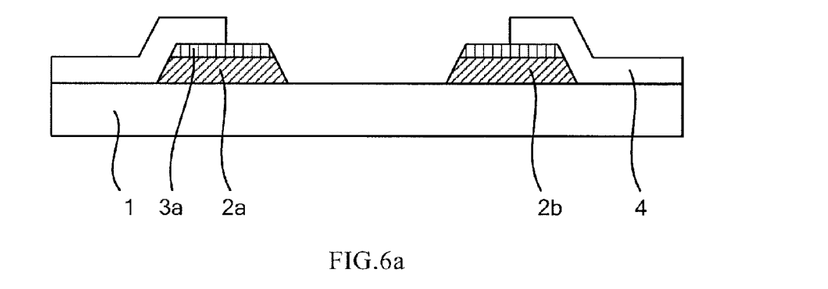
FIG. 6a shows the cross-sectional view after a second patterning process in the first example of the method for manufacturing the first TFT as shown in FIG. 3.
Figure 6B:
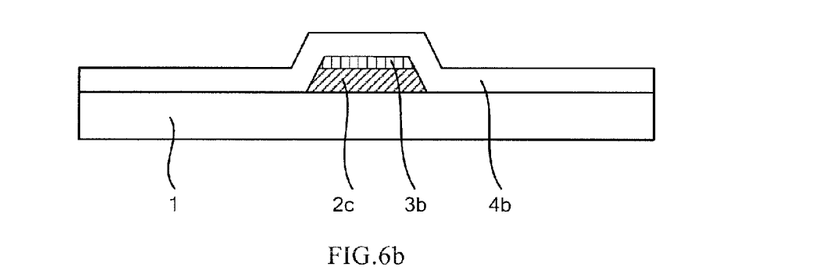
FIG. 6b shows the cross-sectional view after a second patterning process in the first example of the method for manufacturing the second TFT as shown in FIG. 4.

FIG. 6a shows the cross-sectional view after a second patterning process in the first example of the method for manufacturing the first TFT as shown in FIG. 3; FIG. 6b shows the cross-sectional view after a second patterning process in the first example of the method for manufacturing the second TFT as shown in FIG. 4. On the base substrate 1 formed with the patterns shown in FIGS. 5a and 5b, an insulation thin film 4 is formed by deposition, and this insulation thin film 4 may be SiNx or the like. With the second patterning process by using a normal mask plate, the pattern for the first insulation layer 4b of the second TFT is formed; and in the first TFT, the portion of the insulation thin film 4 over the channel region is etched away, and the first doped amorphous silicon layer 3a on the source electrode 2a and the drain electrode 2b is exposed. In the second TFT, the first insulation layer 4b is formed on the gate electrode 2c.

Figure 7A:
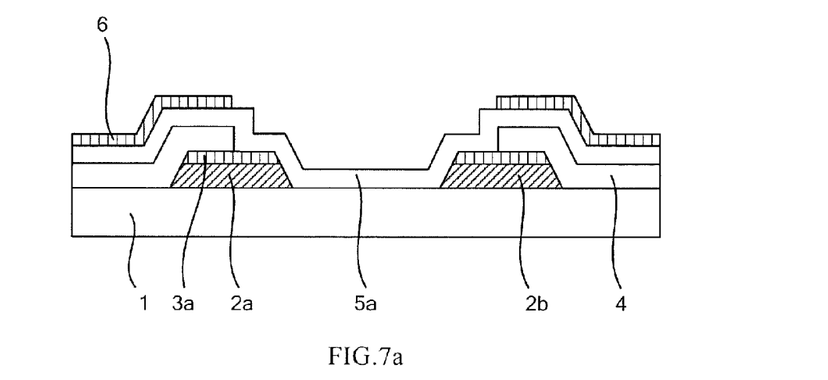
FIG. 7a shows the cross-sectional view after a third patterning process in the first example of the method for manufacturing the first TFT as shown in FIG. 3.
Figure 7B:
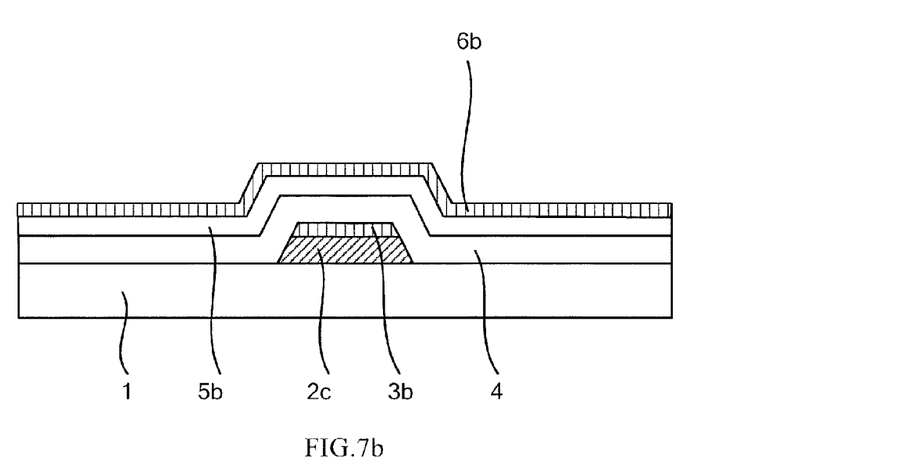
FIG. 7b shows the cross-sectional view after a third patterning process in the first example of the method for manufacturing the second TFT as shown in FIG. 4.

FIG. 7a shows the cross-sectional view after a third patterning process in the first example of the method for manufacturing the first TFT as shown in FIG. 3; FIG. 7b shows the cross-sectional view after a third patterning process in the first example of the method for manufacturing the second TFT as shown in FIG. 4. On the base substrate with the patterns shown in FIGS. 6a and 6b, an amorphous silicon thin film 5 and a doped amorphous silicon thin film 6 are deposited in order; with the third patterning process by using a normal mask plate, the doped amorphous silicon thin film 6 over the channel region of the first TFT is removed by etching, and the amorphous silicon layer 5a of the first TFT are formed, and the amorphous silicon layer 5b and the second doped amorphous silicon layer 6b of the second TFT are formed.

Figure 8:
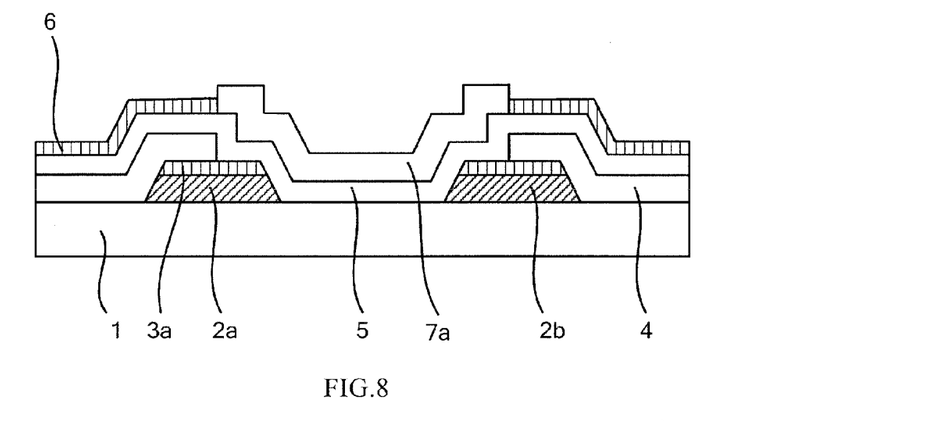
FIG. 8 shows the cross-sectional view after a fourth patterning process in the first example of the method for manufacturing the first TFT as shown in FIG. 3.

FIG. 8 shows the cross-sectional view after a fourth patterning process in the first example of the method for manufacturing the first TFT as shown in FIG. 3. The cross-sectional view after the fourth patterning process in the first example of the method for manufacturing the second TFT is the same as that in FIG. 7b. On the base substrate 1 formed with the patterns shown in FIGS. 7a and 7b, an insulation thin film is deposited, and this insulation thin film may be SiNx or the like. With the fourth patterning process by using a normal mask plate, the insulation thin film on the source electrode 2a and the drain electrode 2b of the first TFT are left but the insulation thin film in the remaining regions on the base substrate is removed, forming the pattern of the second insulation layer 7a of the first TFT.

On the base substrate after the fourth patterning process, a layer of metal thin film is deposited; with a fifth patterning process, the pattern of the gate electrode 8a of the first TFT is formed; and at the same time, pattern including the source electrode 8b, the drain electrode 8c and the channel of the second TFT is formed.

Figure 9A:
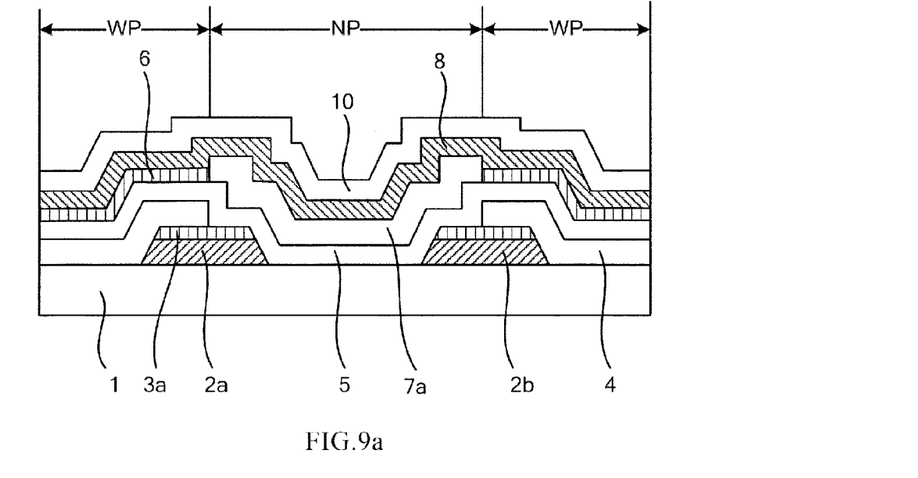
FIG. 9a shows the cross-sectional view for exposure in a fifth patterning process in the first example of the method for manufacturing the first TFT as shown in FIG. 3.
Figure 9B:
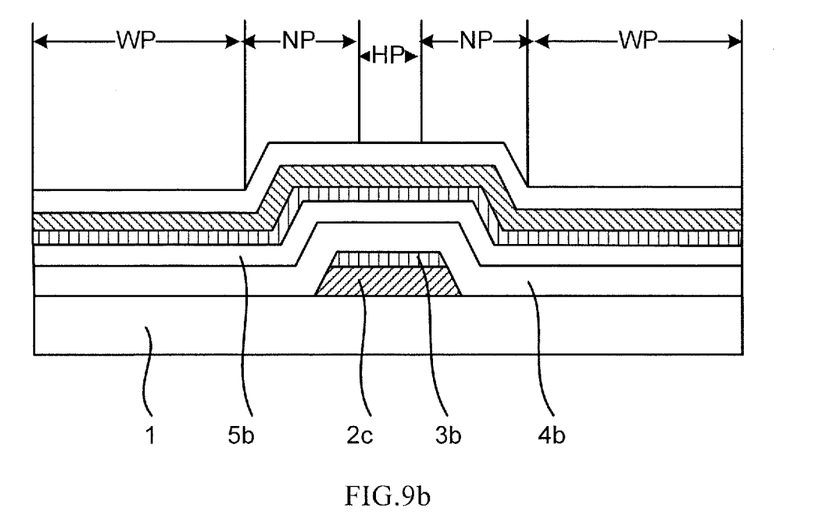
FIG. 9b shows the cross-sectional view for exposure in the fifth patterning process in the first example of the method for manufacturing the second TFT as shown in FIG. 4.

An example of the fifth patterning process may employ a half tone or grey tone mask plate to form photoresist pattern for etching. FIG. 9a shows the cross-sectional view for exposure in a fifth patterning process in the first example of the method for manufacturing the first TFT as shown in FIG. 3; FIG. 9b shows the cross-sectional view for exposure in the fifth patterning process in the first example of the method for manufacturing the second TFT as shown in FIG. 4. In particular, on the base substrate after the fourth patterning process, a layer of metal thin film 8 is deposited, and a photoresist layer 10 is applied on the metal thin film 8; with a half tone or grey tone mask plate, the photoresist layer is exposed. The gate electrode 8a of the first TFT and the source electrode 8b and the drain electrode 8c of the second TFT correspond to an unexposed region (NP), in which the unexposed photoresist is retained after development, the channel region of the second TFT correspond to a partially-exposed region (HP), in which the partially-exposed photoresist are partially retained after development and thinner than that in the unexposed region, and the remaining regions on the base substrate corresponds to a completely-exposed region (WP), in which the completely-exposed photoresist are completely removed after development.

Figure 10A:
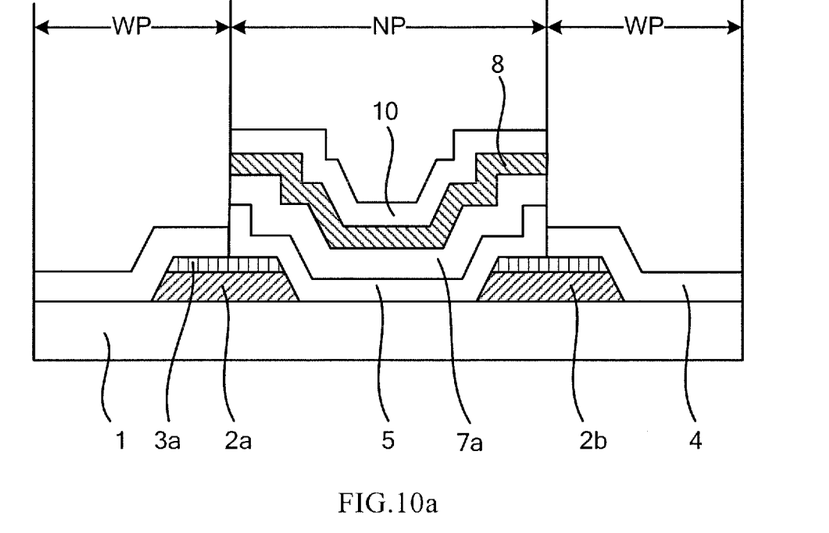
FIG. 10a shows the cross-sectional view after the first etching in the fifth patterning process in the first example of the method for manufacturing the first TFT as shown in FIG. 3.
Figure 10B:
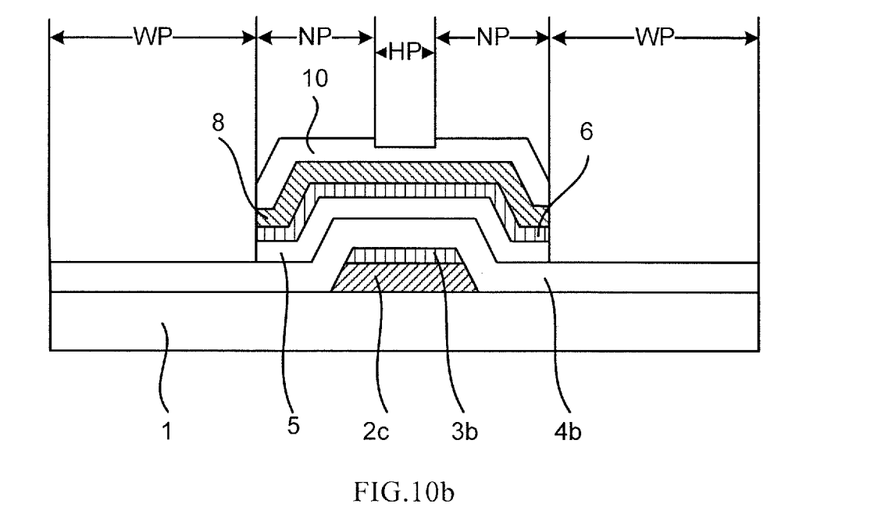
FIG. 10b shows the cross-sectional view after the first etching in the fifth patterning process in the first example of the method for manufacturing the second TFT as shown in FIG. 4.

After development, by a first etching with the formed pattern of photoresist 10, the metal thin film 8, the doped amorphous silicon thin film 6 and the amorphous silicon thin film 5 in the completely-exposed region are removed. FIG. 10a shows the cross-sectional view after the first etching in the fifth patterning process in the first example of the method for manufacturing the first TFT as shown in FIG. 3; FIG. 10b shows the cross-sectional view after the first etching in the fifth patterning process in the first example of the method for manufacturing the second TFT as shown in FIG. 4. After the first etching, the gate electrode 8a of the first TFT is formed.

Figure 11A:
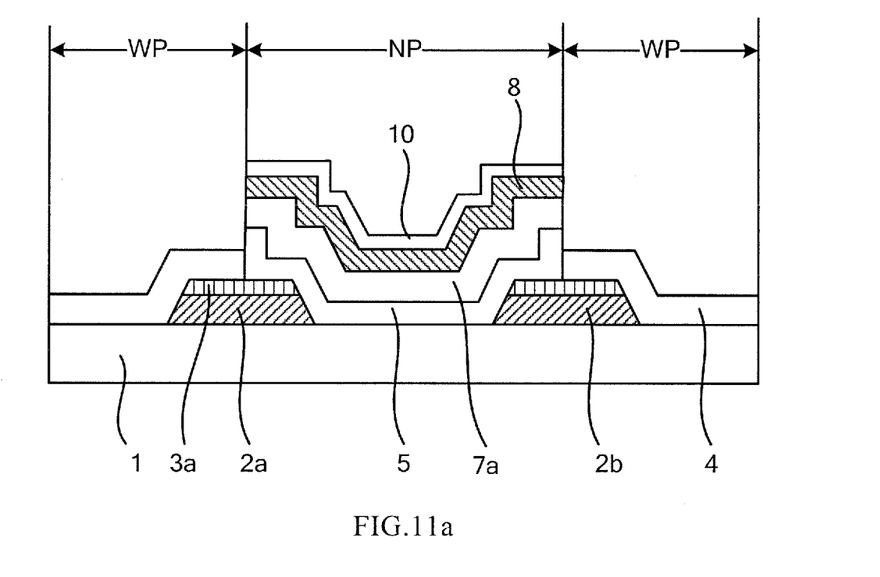
FIG. 11a shows the cross-sectional view after the ashing process in the fifth patterning process in the first example of the method for manufacturing the first TFT as shown in FIG. 3.
Figure 11B:
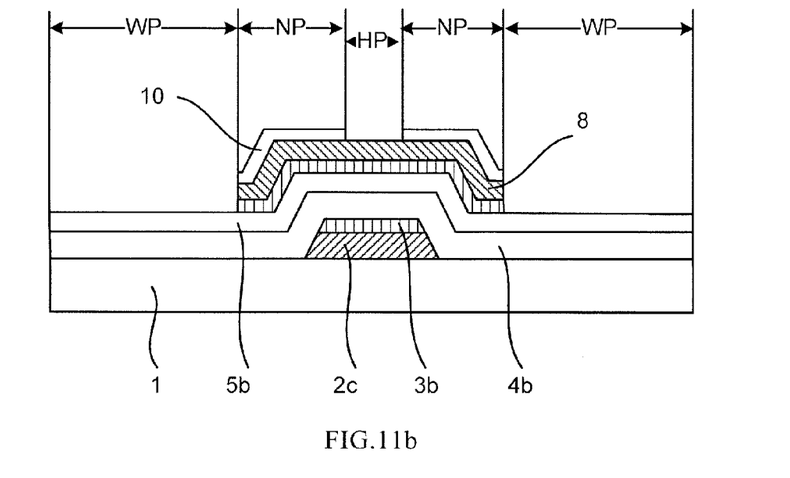
FIG. 11b shows the cross-sectional view after the ashing process in the fifth patterning process in the first example of the method for manufacturing the second TFT as shown in FIG. 4.

With an ashing process, the photoresist in the partially-exposed region (HP) is removed, and the photoresist in the unexposed region (NP) is reduced in thickness. FIG. 11a shows the cross-sectional view after the ashing process in the fifth patterning process in the first example of the method for manufacturing the first TFT as shown in FIG. 3; FIG. 11b shows the cross-sectional view after the ashing process in the fifth patterning process in the first example of the method for manufacturing the second TFT as shown in FIG. 4.

Figure 12A:
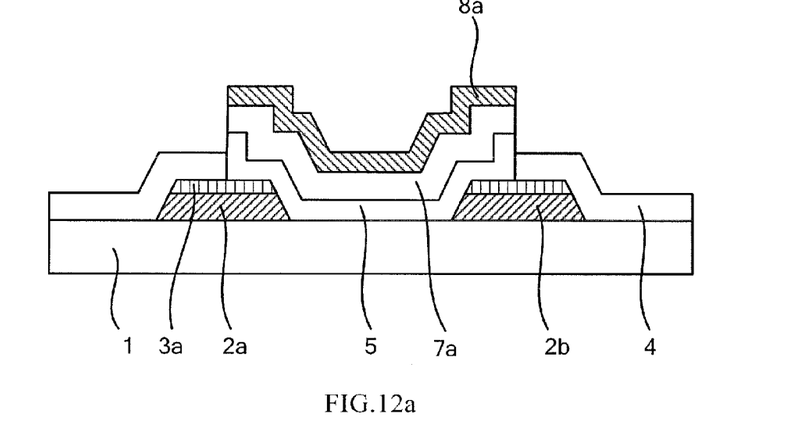
FIG. 12a shows the cross-sectional view after the fifth patterning process in the first example of the method for manufacturing the first TFT as shown in FIG. 3.
Figure 12B:
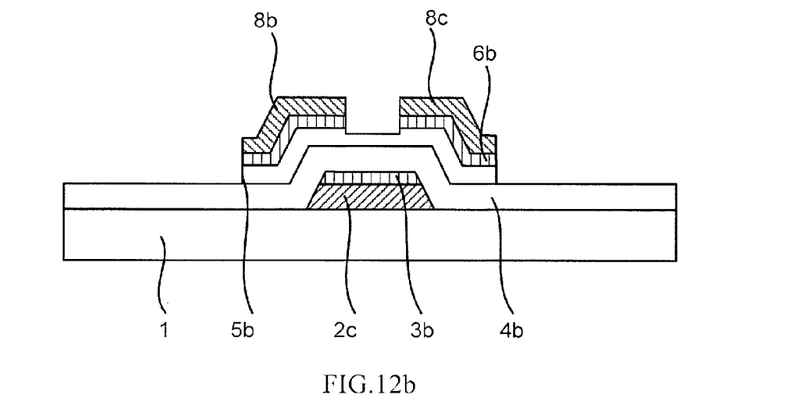
FIG. 12b shows the cross-sectional view after the fifth patterning process in the first example of the method for manufacturing the second TFT as shown in FIG. 4.

After the ashing process, a second etching is performed with the remained pattern of photoresist 10, in which the doped amorphous silicon thin film 6 in the channel region is removed, and also the amorphous silicon thin film 5 is partially removed in the thickness direction, forming the pattern of the channel region of the second TFT, and further the photoresist in the unexposed region (NP) is removed. FIG. 12a shows the cross-sectional view after the fifth patterning process in the first example of the method for manufacturing the first TFT as shown in FIG. 3; FIG. 12b shows the cross-sectional view after the fifth patterning process in the first example of the method for manufacturing the second TFT as shown in FIG. 4.

After the fifth patterning process, the pattern of the gate electrode 8a and the amorphous silicon layer 5a of the first TFT are formed, and as well the source electrode 8b, the drain electrode 8c, the amorphous silicon layer 5b, the second doped amorphous silicon layer 6b and the channel of the second TFT are formed.

On the base substrate after the fifth patterning process, a layer of passivation thin film may be further deposited, forming a passivation layer 9a of the first TFT and a passivation layer 9b of the second TFT at the same time. The passivation layer 9a and the passivation layer 9b cover the first TFT and the second TFT and function to protect the first TFT and the second TFT, respectively.

After forming the first TFT and the second TFT, via holes may be further formed in the passivation layer 9a or 9b with an additional patterning process, so that the first TFT and the second TFT can be connected with other elements in corresponding pixel regions of the array substrate.

Second Example of Manufacturing Method

The first two patterning processes of the second example are the same as those conducted in the first example, thus the description thereof are omitted here for simplicity.

Figure 13A:
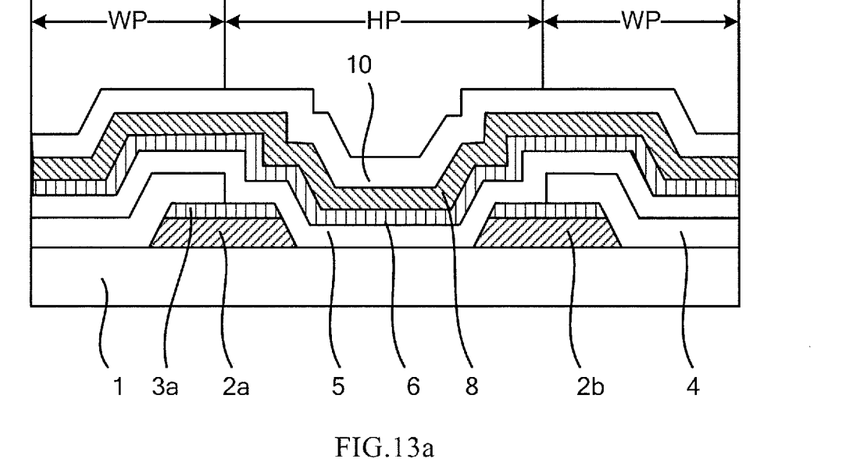
FIG. 13a shows the cross-sectional view after a third patterning process in the second example of the method for manufacturing the first TFT as shown in FIG. 3.
Figure 13B:
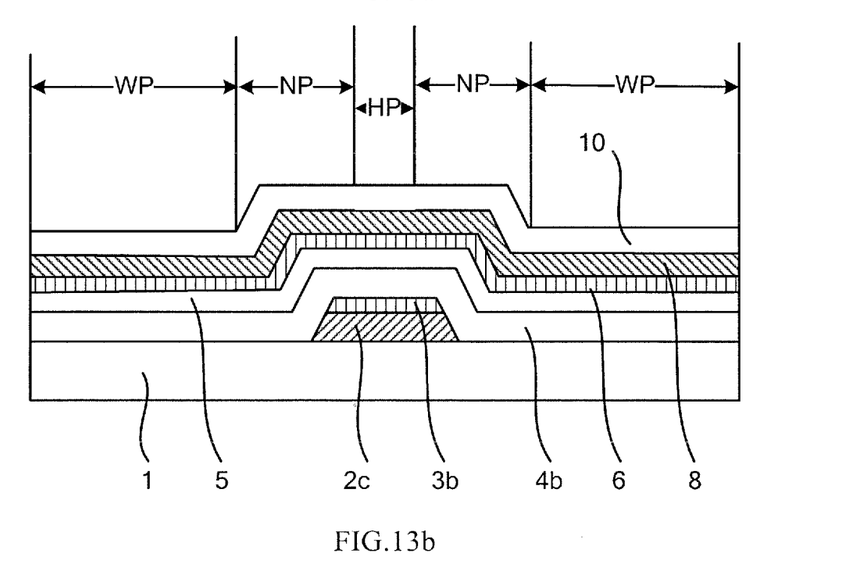
FIG. 13b shows the cross-sectional view after the third patterning process in the second example of the method for manufacturing the second TFT as shown in FIG. 4.

FIG. 13a shows the cross-sectional view after a third patterning process in the second example of the method for manufacturing the first TFT as shown in FIG. 3; FIG. 13b shows the cross-sectional view after the third patterning process in the second example of the method for manufacturing the second TFT as shown in FIG. 4. After the base substrate after the first two patterning processes, an amorphous silicon thin film 5, a doped amorphous silicon thin film 6, and a metal thin film 8 are formed on the base substrate in order, and a layer of photoresist 10 is applied on the layer of the metal thin film 8. In the exposure with a half tone or grey tone mask plate, the source electrode and the drain electrode of the second TFT corresponds to the unexposed region (NP); the source electrode, the drain electrode and the channel region of the first TFT and the channel region of the second TFT correspond to the partially-exposed region (HP); and the remaining regions correspond to the completely-exposed region (WP).

Figure 14A:
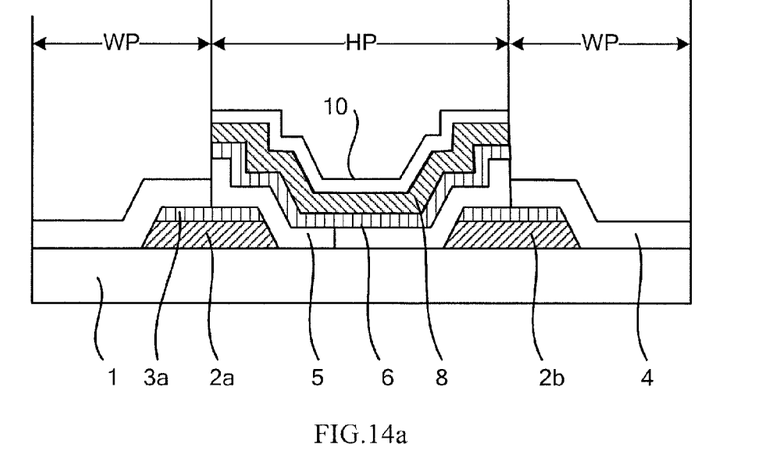
FIG. 14a shows the cross-sectional view after the first etching of the third patterning process in the second example of the method for manufacturing the first TFT as shown in FIG. 3.
Figure 14B:
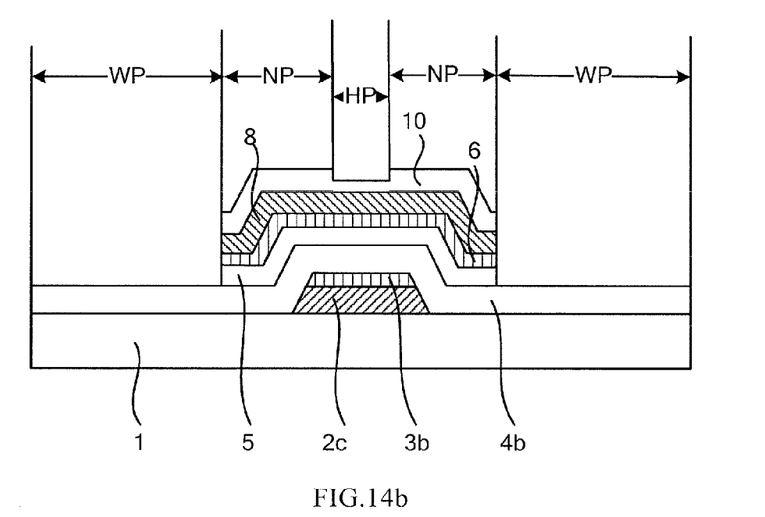
FIG. 14b shows the cross-sectional view after the first etching of the third patterning process in the second example of the method for manufacturing the second TFT as shown in FIG. 4.

After the first etching with the formed photoresist pattern, the amorphous silicon thin film 5, the doped amorphous silicon thin film 6 and the metal thin film 8 that are in the completely-exposed region are removed. FIG. 14a shows the cross-sectional view after the first etching of the third patterning process in the second example of the method for manufacturing the first TFT as shown in FIG. 3; FIG. 14b shows the cross-sectional view after the first etching of the third patterning process in the second example of the method for manufacturing the second TFT as shown in FIG. 4.

Figure 15A:
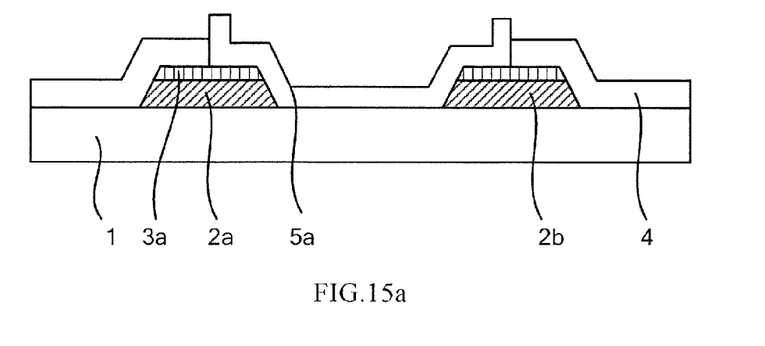
FIG. 15a shows the cross-sectional view after the third patterning process in the second example of the method for manufacturing the first TFT as shown in FIG. 3.
Figure 15B:
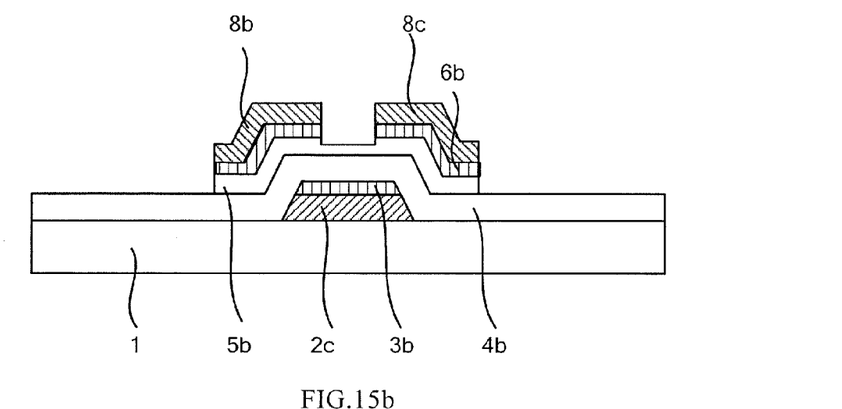
FIG. 15b shows the cross-sectional view after the third patterning process in the second example of the method for manufacturing the second TFT as shown in FIG. 4.

The remained photoresist layer is subject to an aching process, so that the photoresist 10 in the partially-exposed region is removed, and the photoresist in the unexposed region is reduced in thickness. Then, a second etching is conducted on the base substrate with the remained pattern of photoresist 10, the metal thin film and the amorphous silicon thin film that are in the region corresponding to the gate electrode of the first TFT are removed so as to form the amorphous silicon layer 5a of the first TFT; the doped amorphous silicon thin film and a part of the amorphous silicon thin film in thickness direction that are in the channel region of the second TFT are removed so as to form the amorphous silicon layer 5b, the second doped amorphous silicon layer 6b, the source electrode 8b, the drain electrode 8c and channel of the second TFT. FIG. 15a shows the cross-sectional view after the third patterning process in the second example of the method for manufacturing the first TFT as shown in FIG. 3; FIG. 15b shows the cross-sectional view after the third patterning process in the second example of the method for manufacturing the second TFT as shown in FIG. 4.

Figure 16A:
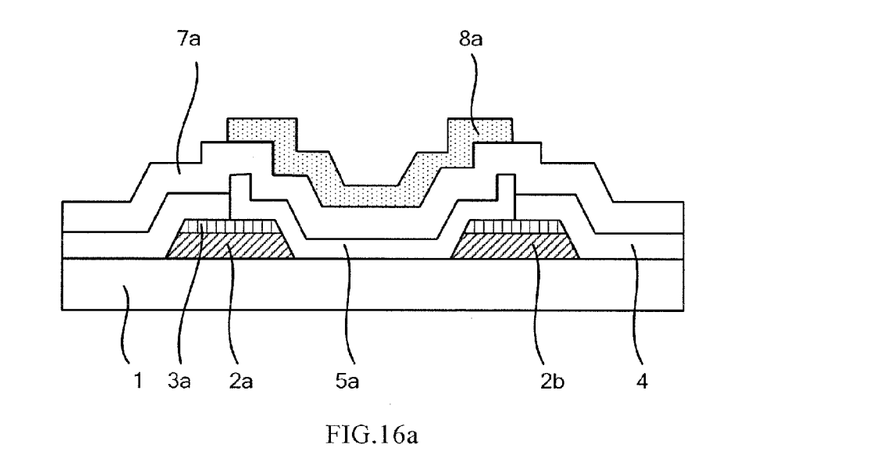
FIG. 16a shows the cross-sectional view after a fourth patterning process in the second example of the method for manufacturing the first TFT as shown in FIG. 3.
Figure 16B:
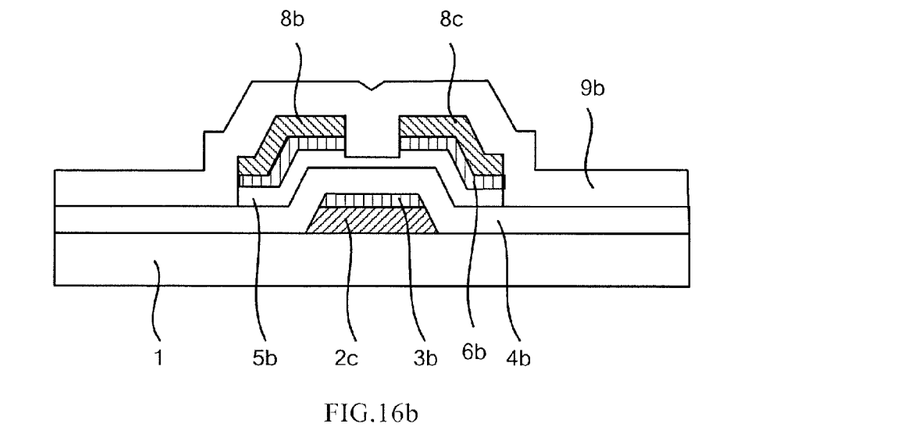
FIG. 16b shows the cross-sectional view after the fourth patterning process in the second example of the method for manufacturing the second TFT as shown in FIG. 4.

FIG. 16a shows the cross-sectional view after a fourth patterning process in the second example of the method for manufacturing the first TFT as shown in FIG. 3; FIG. 16b shows the cross-sectional view after the fourth patterning process in the second example of the method for manufacturing the second TFT as shown in FIG. 4. On the base substrate after the third patterning process, an insulation thin film is formed first and an indium tin oxide (ITO) thin film or a metal thin film (e.g., ITO thin film shown in FIG. 16a) is formed then as well; with a patterning process by using a normal mask plate, the ITO thin film or metal thin film is kept over the source electrode, the drain electrode and the channel region of the first TFT, but the metal thin film or the ITO thin film is removed in the remaining regions, forming the second insulation layer 7a and the gate electrode 8a of the first TFT. The insulation thin film formed in the fourth patterning process can be used as the passivation layer 9b of the second TFT.

Next, an embodiment of the method for manufacturing a driving device of the disclosed technology is described below and includes the following steps.

Step 11, by a patterning process, forming a source electrode, a drain electrode and a first doped amorphous silicon layer of a first TFT on a base substrate, and forming a gate electrode of a second TFT as well on the base substrate.

In Step 11, a first doped amorphous silicon layer of the second TFT can be formed on the gate electrode further. Alternatively, by a patterning process with a half tone or grey tone mask plate, the part of the doped amorphous silicon thin film on the gate electrode of the second TFT is removed, that is, in the Step 11, the first doped amorphous silicon layer of the second TFT may be not formed.

Step 12, by a patterning process, forming an insulation thin film on the base substrate after Step 11, removing the insulation thin film on the channel region of the first TFT by etching, and keeping the insulation thin film on the gate electrode of the second TFT, thus forming the first insulation layer of the second TFT.

Step 13, on the base substrate after Step 12, forming an amorphous silicon layer, a gate electrode and a second insulation layer of the first TFT and forming an amorphous silicon layer, a second doped amorphous silicon layer, a source electrode, a drain electrode and a channel of the second TFT.

An example of Step 13 may include the following sub-steps.

Step 131, on the base substrate after Step 12, an amorphous silicon thin film and a doped amorphous silicon thin film are formed in order, and with a patterning process by using a normal mask plate, the doped amorphous silicon thin film on the source electrode and the drain electrode of the first TFT is removed, so that the amorphous silicon layer of the first TFT is formed, and the amorphous silicon layer and the second doped amorphous silicon layer of the second TFT are formed as well.

Step 132, an insulation thin film is formed on the base substrate after Step 131, with a patterning process by using a normal mask plate, the insulation thin film on the source electrode, the drain electrode and the channel region of the first TFT are kept, but the insulation thin film in remaining regions are removed, thus forming the second insulation layer of the first TFT.

Step 133, a metal thin film is formed on the base substrate after Step 132, and with a patterning process by using a half tone or grey tone mask plate, the gate electrode of the first TFT and the source electrode, the drain electrode and the channel of the second TFT are formed.

Further, an example of the Step 133 may include the following sub-steps.

Step 133a, a metal thin film is formed on the base substrate after Step 132, a photoresist layer is applied on the metal thin film, exposed with a half tone or grey tone mask plate and developed, and then a patterning process is performed to form the gate electrode of the first TFT and the source electrode and the drain electrode of the second TFT, which correspond to an unexposed region, and the channel of the second TFT, which corresponds to the a partially-exposed region, with the remaining regions corresponding to a completely-exposed region.

Step 133b, the amorphous silicon thin film, the doped amorphous silicon thin film and the metal thin film in the completely-exposed region are formed to form the gate electrode of the first TFT.

Step 133c, the photoresist layer is subject to an ashing process to remove the photoresist in the region corresponding to the channel region of the second TFT.

Step 133d, the metal thin film and the doped amorphous silicon thin film in the channel region of the second TFT are removed, and a part of the amorphous silicon thin film in the channel region of the second TFT is removed, thus the source electrode, the drain electrode and the channel of the second TFT are formed.

Another example of the Step 13 may include the following sub-steps.

Step 134, on the base substrate after Step 12, an amorphous silicon thin film, a doped amorphous silicon thin film and a metal thin film are formed in order, and with a patterning process by using a half tone or grey tone mask plate, the amorphous silicon layer of the first TFT are formed, and the amorphous silicon layer, the second doped amorphous silicon layer, the source electrode, the drain electrode and the channel of the second TFT are formed.

Step 135, an insulation thin film and also a metal thin film or an ITO thin film are formed on the base substrate after Step 134, with a patterning process by using a normal mask plate, the metal thin film or the ITO thin film over the source electrode, the drain electrode and the channel region of the first TFT are kept but the metal thin film or the ITO thin film in remaining regions are removed, thus forming the second insulation layer and the gate electrode of the first TFT.

Further, an example of Step 134 includes the following sub-steps.

Step 134a, on the base substrate after Step 12, the amorphous silicon thin film, the doped amorphous silicon thin film and the metal thin film are formed in order; a layer of photoresist is applied on the metal thin film, exposed by using a half tone or grey tone mask plate and developed, wherein the source electrode and the drain electrode of the second TFT corresponds to an unexposed region, the source electrode, the drain electrode and the channel region of the first TFT and the channel region of the second TFT corresponds to a partially-exposed region, and the remaining region corresponds to a completely-exposed region.

Step 134b, the amorphous silicon thin film, the doped amorphous silicon thin film and the metal thin film in the completely-exposed region are removed by etching.

Step 134c, the photoresist layer is subject to an ashing process, and then with the remained photoresist pattern, the metal thin film and the amorphous silicon thin film in the region corresponding to the gate electrode of the first TFT are removed, forming the amorphous silicon layer of the first TFT; also, the doped amorphous silicon thin film and a part of the amorphous silicon thin film that are in the channel region of the second TFT are removed, forming the amorphous silicon layer, the second doped amorphous silicon layer, the source electrode, the drain electrode and the channel region of the second TFT.

An example of the Step 135 may be formed as follows. On the base substrate after Step 134, an insulation thin film and a metal thin film or an ITO thin film are formed; with a patterning process by using a normal mask plate, the metal thin film or ITO thin film over the source electrode, the drain electrode and the channel region of the first TFT are kept, but the metal thin film or ITO thin film in the remaining is removed, thus forming the second insulation layer and the gate electrode of the first TFT.

The embodiments of the manufacturing method for the driving device are made with reference to the first TFT and the second TFT as shown in the FIG. 3 and FIG. 4, respectively.

In the embodiments according to the disclosed technology, a part of the first TFT and a part of the second TFT are formed in each patterning process, and the structure of the first TFT and second TFT can be formed together but not separately, thus reducing the times of the necessary patterning processes, simplifying procedures, and lowering costs.

Another embodiment of the disclosed technology further provides a TFT-LCD, which comprises a backlight and one example of the above-described TFT-LCD driving device, in which the amorphous silicon layer of a first TFT of the driving device can be illuminated by the backlight, thus the first TFT of the driving device can be of a small size and as well ensure the driving capacity, and furthermore, because the first TFT may adopt a top-gate configuration, the first TFT is illuminated when turned off, and a relative high voltage can be applied to the gate electrode to turn off the first TFT smoothly.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A driving device for a thin film transistor liquid crystal display (TFT-LCD), comprising:
   at least one first TFT and at least one second TFT formed on a base substrate;
   a clock signal input terminal; and
   a ground terminal;
   wherein the first TFT is of a top-gate configuration, and the second TFT is of a bottom-gate configuration, and the first TFT is configured to allow its amorphous semiconductor layer to be illuminated by light emitted from a backlight of the TFT-LCD to increase its turning-on current; and
   wherein one of a source electrode and a drain electrode of the first TFT is a driving signal output terminal of the driving device, the other of the source electrode and the drain electrode of the first TFT is connected with the clock signal input terminal for receiving a clock signal,
   one of a source electrode or a drain electrode of the second TFT is electrically connected with the driving signal output terminal of the driving device, and the other of the source electrode and the drain electrode of the second TFT is electrically connected with the ground terminal.

2. The driving device according to claim 1, wherein the first TFT comprises:
   the source electrode and the drain electrode formed on the base substrate;
   a first doped amorphous silicon layer formed on the source electrode and the drain electrode;
   an amorphous silicon layer formed on the first doped amorphous silicon layer and a channel region of the first TFT;
   a second insulation layer formed on the amorphous silicon layer; and
   a gate electrode formed on the second insulation layer.

3. The driving device according to claim 2, wherein the second TFT comprises:
   a gate electrode formed on the base substrate;
   a first insulation layer formed on the gate electrode;
   an amorphous silicon layer formed on the first insulation layer;
   a second doped amorphous silicon layer formed on the amorphous silicon layer; and
   the source electrode and the drain electrode formed on the second doped amorphous silicon layer, and wherein a channel is defined between the source electrode and the drain electrode.

4. The driving device according to claim 3, wherein the gate electrode of the first TFT comprises a metal material or an indium tin oxide material.

5. The driving device according to claim 1, wherein the first TFT only has the top-gate configuration, and the second TFT only has the bottom-gate configuration.

* * * * *